(12) United States Patent
Zhang et al.

(10) Patent No.: US 10,720,096 B2
(45) Date of Patent: Jul. 21, 2020

(54) DISPLAY PANEL AND DISPLAY APPARATUS

(71) Applicant: Shanghai Tianma Micro-Electronics Co., Ltd., Shanghai (CN)

(72) Inventors: Min Zhang, Shanghai (CN); Xiangjian Kong, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/201,488

(22) Filed: Nov. 27, 2018

(65) Prior Publication Data

US 2020/0058247 A1    Feb. 20, 2020

(30) Foreign Application Priority Data

Aug. 14, 2018   (CN) .......................... 2018 1 0921480

(51) Int. Cl.
  *G09G 3/22*      (2006.01)
  *G02F 1/1362*    (2006.01)
  *H01L 27/32*     (2006.01)

(52) U.S. Cl.
  CPC .......... *G09G 3/22* (2013.01); *G02F 1/136209* (2013.01); *H01L 27/322* (2013.01); *H01L 27/3211* (2013.01)

(58) Field of Classification Search
  CPC . G09G 3/22; G02F 1/136209; H01L 27/3211; H01L 27/322
  USPC ..................................... 345/690; 1/1; 349/38
  See application file for complete search history.

(56) References Cited

U.S. PATENT DOCUMENTS

| 10,223,954 | B2* | 3/2019 | Jin ...................... G09G 3/2003 |
| 2008/0002073 | A1* | 1/2008 | Hwan Moon ..... G02F 1/133512 349/38 |
| 2013/0201432 | A1* | 8/2013 | Yun .................. G02F 1/134309 349/123 |
| 2015/0091953 | A1* | 4/2015 | Wu ...................... G09G 3/2007 345/690 |
| 2015/0198825 | A1* | 7/2015 | Choi ................. G02F 1/133377 349/86 |
| 2016/0109767 | A1* | 4/2016 | Yun .................. G02F 1/134309 349/129 |
| 2016/0365042 | A1* | 12/2016 | Zheng ..................... G09G 3/36 |

(Continued)

FOREIGN PATENT DOCUMENTS

CN        107966849 A    4/2018

*Primary Examiner* — Prabodh M Dharia
(74) *Attorney, Agent, or Firm* — Anova Law Group PLLC

(57) ABSTRACT

A display panel and a display apparatus are provided. An exemplary display panel includes a display area; a non-display area; a plurality of pixels, including a plurality of edge pixels and a plurality of compensation pixels, arranged as an array along a row direction and a column direction and having a plurality of pixel rows and a plurality of pixel columns; and a light shielding layer. At least portions of transmission areas of the edge pixels are disposed in the display area; entire transmission areas of the compensation pixels are disposed in the non-display area; and a distance d between a first compensation pixel in a first pixel row and a second compensation pixel in a second pixel row is smaller than a distance D between a first edge pixel in the first pixel row and a second edge pixel in the second pixel row.

20 Claims, 12 Drawing Sheets

(56) References Cited

U.S. PATENT DOCUMENTS

| | | | |
|---|---|---|---|
| 2018/0158434 A1* | 6/2018 | Bian | G09G 5/10 |
| 2018/0373078 A1* | 12/2018 | Mizuno | G09G 3/20 |
| 2019/0196078 A1* | 6/2019 | Kim | G02F 1/133512 |
| 2019/0305057 A1* | 10/2019 | Cheng | H01L 27/3246 |
| 2019/0325827 A1* | 10/2019 | Lee | H05K 5/0017 |

\* cited by examiner

DISPLAY PANEL AND DISPLAY APPARATUS

CROSS-REFERENCES TO RELATED APPLICATIONS

This application claims priority of Chinese Patent Application No. 201810921480.3, filed on Aug. 14, 2018, the entire contents of which are hereby incorporated by reference.

FIELD OF THE DISCLOSURE

The present disclosure generally relates to the field of display technology and, more particularly, relates to a display panel and a display apparatus.

BACKGROUND

With the continuous development of display technology, the traditional rectangular display panel has been unable to meet the diverse needs of users, and the special-shaped display panel has become one of the research directions in the field of display technology.

Unlike the rectangular display panel, the boundary area of the active area of the special-shaped display panel and the boundary of the RGB color filter area do not coincide. Because the display pixels are mostly rectangular-shaped, if a certain compensation method is not used, zigzag shapes can be very obvious at the boundary area, and the display condition at the boundary area is deteriorated.

Therefore, there is a need to improve the display effect of the display area near the special-shaped edge area (i.e., boundary area). The disclosed display panel and display apparatus are directed to solve one or more problems set forth above and other problems in the art.

BRIEF SUMMARY OF THE DISCLOSURE

One aspect of the present disclosure provides a display panel. The display panel includes a display area; a non-display area; a plurality of pixels, including a plurality of edge pixels and a plurality of compensation pixels, arranged as an array along a row direction and a column direction and having a plurality of pixel rows and a plurality of pixel columns; and a light shielding layer. The plurality of pixel rows include at least two adjacent pixel rows; at least portions of transmission areas of the edge pixels are disposed in the display area; entire transmission areas of the compensation pixels are disposed in the non-display area; and a distance d between a first compensation pixel in a first pixel row of the two adjacent pixel rows and a second compensation pixel in a second pixel row of the two adjacent pixel rows is smaller than a distance D between a first edge pixel in the first pixel row and a second edge pixel in the second pixel row. Each of the plurality of pixels includes a reflective area and a transmission area; the display panel includes a first edge; the first edge is disposed in an area where a first pixel row and a second pixel row are disposed; in a same pixel row, at a side of the edge pixels away from the display area, the transmission areas of pixels adjacent to the edge pixels are entirely disposed in the non-display area; at a side of the edge pixels adjacent to the display area, at least portions of the transmission areas of the pixels adjacent to the edge pixels are disposed in the display area; portions of the transmission areas of the compensation pixels are not covered by the light shielding layer; an edge pixel in the first pixel row is configured as a first edge pixel; an edge pixel in the second pixel row and, along the row direction, having a smallest distance with the first edge pixel, is configured as a second edge pixel; a compensation pixel in a plurality of compensation pixels in the first pixel row at a side of the first edge away from the display are and having a largest distance with the first edge is configured as the first compensation pixel; and a compensation pixel in a plurality of compensation pixels in the second pixel row at the side of the first edge away from the display area and having a largest distance with the first edge is configured as the second compensation pixel.

Another aspect of the present disclosure provides a display apparatus. The display apparatus includes a display panel. The display panel includes a display area; a non-display area; a plurality of pixels, including a plurality of edge pixels and a plurality of compensation pixels and arranged as an array along a row direction and a column direction; and a light shielding layer. The display panel includes a display area; a non-display area; a plurality of pixels, including a plurality of edge pixels and a plurality of compensation pixels, arranged as an array along a row direction and a column direction and having a plurality of pixel rows and a plurality of pixel columns; and a light shielding layer. The plurality of pixel rows include at least two adjacent pixel rows; at least portions of transmission areas of the edge pixels are disposed in the display area; entire transmission areas of the compensation pixels are disposed in the non-display area; and a distance d between a first compensation pixel in a first pixel row of the two adjacent pixel rows and a second compensation pixel in a second pixel row of the two adjacent pixel rows is smaller than a distance D between a first edge pixel in the first pixel row and a second edge pixel in the second pixel row. Each of the plurality of pixels includes a reflective area and a transmission area; the display panel includes a first edge; the first edge is disposed in an area where a first pixel row and a second pixel row are disposed; in a same pixel row, at a side of the edge pixels away from the display area, the transmission areas of pixels adjacent to the edge pixels are entirely disposed in the non-display area; at a side of the edge pixels adjacent to the display area, at least portions of the transmission areas of the pixels adjacent to the edge pixels are disposed in the display area; portions of the transmission areas of the compensation pixels are not covered by the light shielding layer; an edge pixel in the first pixel row is configured as a first edge pixel; an edge pixel in the second pixel row and, along the row direction, having a smallest distance with the first edge pixel, is configured as a second edge pixel; a compensation pixel in a plurality of compensation pixels in the first pixel row at a side of the first edge away from the display are and having a largest distance with the first edge is configured as the first compensation pixel; and a compensation pixel in a plurality of compensation pixels in the second pixel row at the side of the first edge away from the display area and having a largest distance with the first edge is configured as the second compensation pixel.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
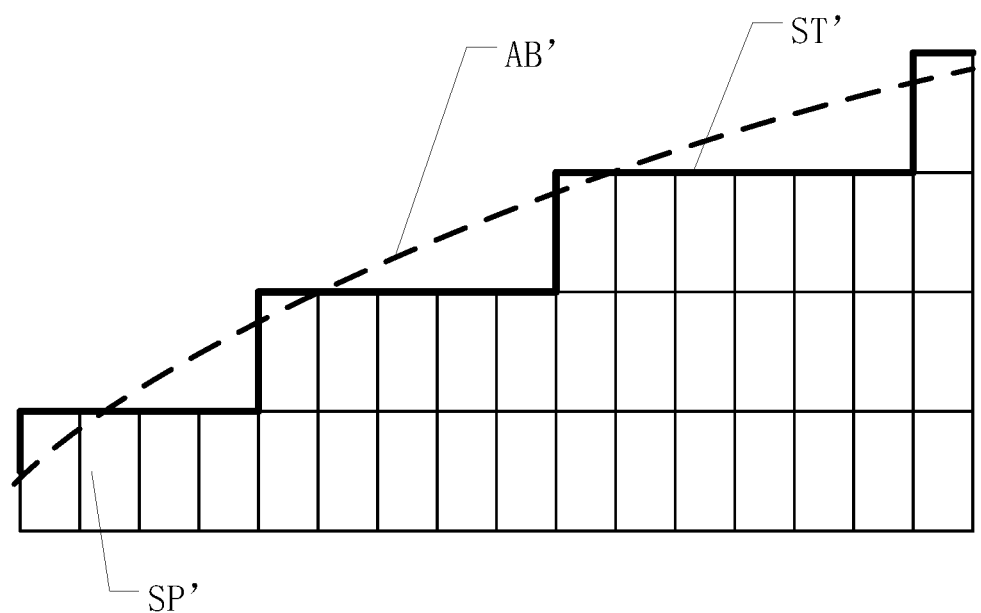
FIG. 1 illustrates a portion of a special-shaped display panel.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods, and apparatus that are understandable to the persons of ordinary skill in the art may not be described in detail. However, under appropriate conditions, such techniques, methods and apparatus are also included as the parts of the description.

In the disclosed embodiments, specific values may be explained for illustrative purposes and might not be used as limitations. Thus, embodiments may have different specific values.

Further, the similar symbols and letters in the drawings may denote similar elements. Thus, once one element is defined in one drawing, it may not need to be defined in the following drawings.

FIG. 1 illustrates a portion of a special-shaped display panel. As shown in FIG. 1, the display area of the display panel is specially shaped. The specially shaped display area causes the display panel to have the special-shaped boundary AB' in the display area. The special-shaped display panel includes a plurality of rectangular sub-pixel SP'. When the rectangular sub-pixels SP' are used in the special-shaped display panel, the sub-pixels SP' and the special-shaped boundary AB' do not entirely coincide. Such a mismatch causes the display area of the special-shaped display panel adjacent to the special-shaped boundary AB' to be rendered as zigzag shaped patterns ST' when displaying. The patterns at the boundary area are not rounded and smooth, the display effect at the display area adjacent to the special-shaped boundary is adversely affected. Such a technical problem also exists in the transflective display panel.

The present disclosure provides a display panel and a display apparatus with improved display effect at the display area adjacent to the special-shaped boundary.

Figure 2:
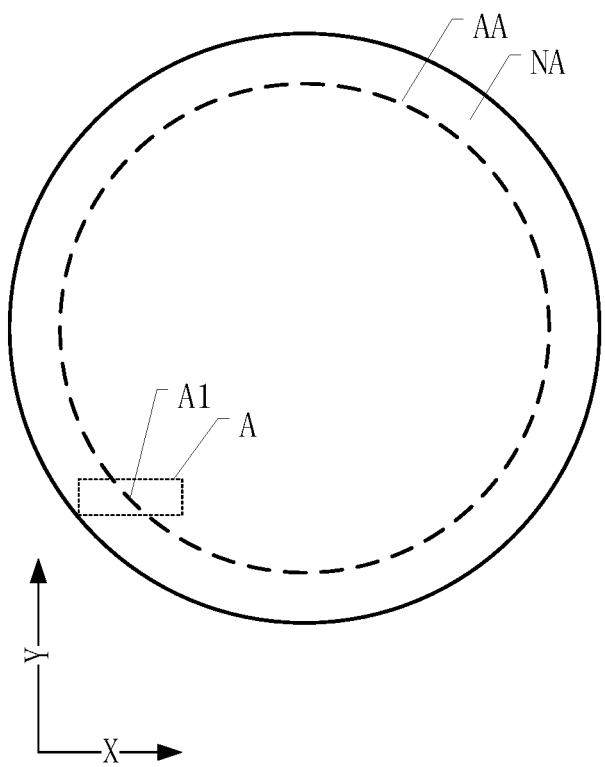
FIG. 2 illustrates an exemplary display panel consistent with various disclosed embodiments.
Figure 3:
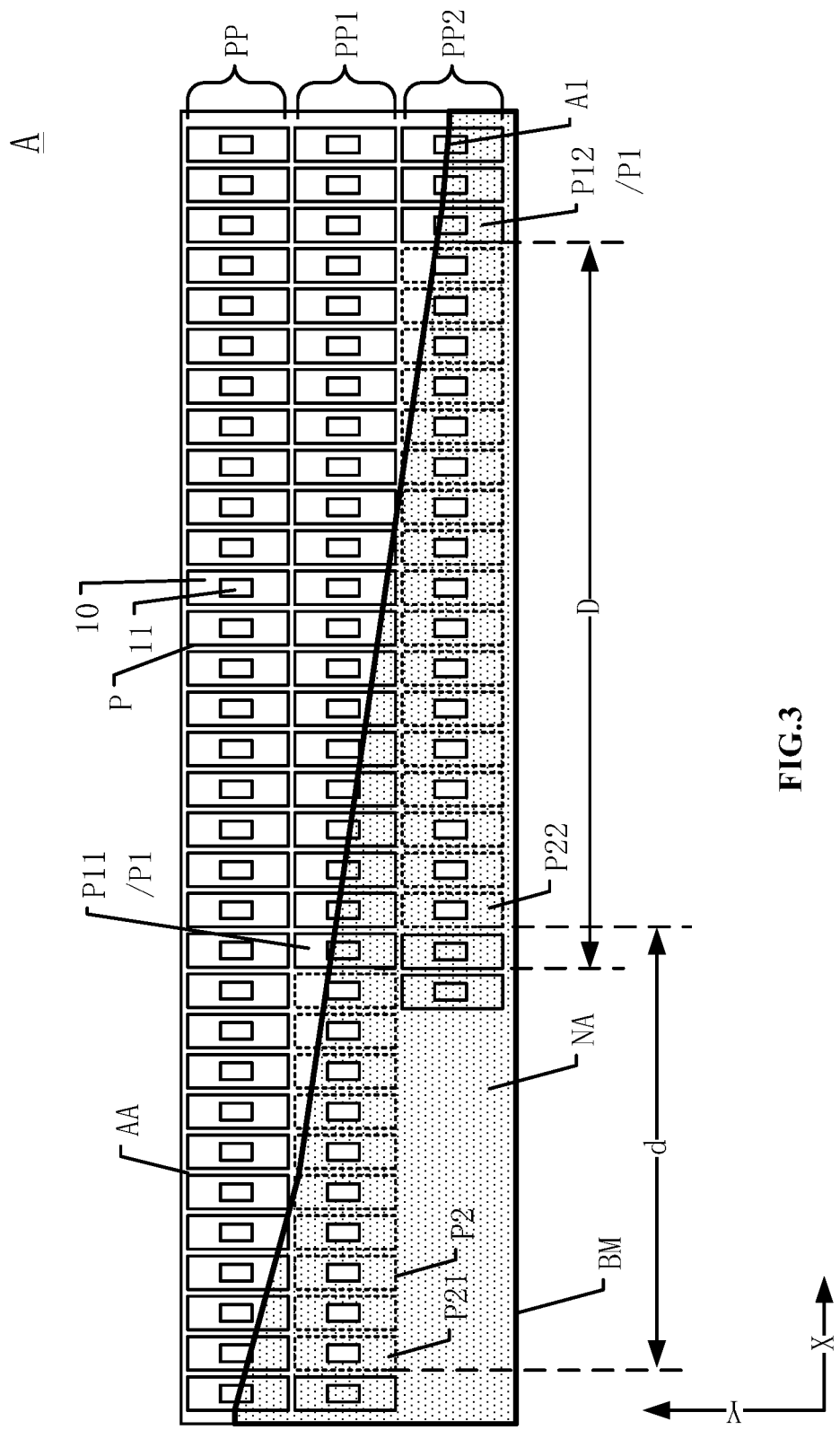
FIG. 3 illustrates a zoomed-in view of the region A in FIG. 2.

FIG. 2 illustrates an exemplary display panel consistent with various disclosed embodiments. FIG. 3 illustrates a zoomed-in view of the region A in FIG. 2.

As shown in FIGS. 2-3, the display panel may include a display area AA and a non-display area NA. The display panel may include a plurality of pixels P. Each pixel P may include a reflective area 10 and a transmission area 11.

The plurality of pixels P may be arranged as an array along a row direction X and a column direction Y. A plurality of pixels P disposed in the same row along the row direction X may be referred to as a pixel row PP. The display panel may include at least two adjacent pixel rows PP. The two adjacent pixel rows PP may include a first pixel row PP1 and a second pixel row PP2. The display area AA may include a first edge A1; and the first edge A1 may be disposed at the area where the first pixel row PP1 and the second pixel row PP2 are disposed.

The plurality of pixels P may include a plurality of edge pixels P1, and at least portions of the transmission areas 11 of the edge pixels P1 may be disposed in the display area AA. Further, in a same pixel row PP, the transmission areas 11 of the pixels P at the side of the edge pixels P1 away from the display region AA and adjacent to the edge pixels P1 may all be disposed in the non-display region NA; and at least portions of the transmission areas 11 of the pixels P at the side of the edge pixels P1 adjacent to the display area AA and adjacent to the edge pixels P1 may be disposed in the display area AA. In particular, in the first pixel row PP1, the edge pixels P1 are at the side indicated by the arrow in the row direction X shown in FIG. 3, and the transmission areas 11 of a plurality of sequential pixels P adjacent to the edge pixels P1 may be partially disposed in the display area AA. Then, the transmission areas 11 of another plurality of sequential pixels P may be entirely disposed in the display area A. At the side opposite to the arrow direction X, the transmission areas 11 of a plurality of sequential pixels P adjacent to the edge pixels P1 may be entirely disposed in the non-display area AA.

The plurality of pixels P may also include a plurality of compensation pixels P2. The transmission areas 11 of the compensation pixels P2 may be entirely disposed in the non-display area NA.

Further, the display panel may include a light shield layer BM. At least portions of the transmission areas 11 of the compensation pixels P2 may not be covered by the light shield layer BM.

An edge pixel P1 in the first pixel row PP1 may be configured as a first edge pixel P11. Along the row direction X, an edge pixel P1 in the second pixel row PP2 and having a smallest distance with the first edge pixel P11 may be configured as a second edge pixel P12. Along the row direction X, the distance between the first edge pixel P11 and the second edge pixel P12 may be referred to as D.

At the side way from the display area AA, the first pixel row PP1 may include a plurality of compensation pixels P2; and the compensation pixel P2 having the largest distance with the first edge A1 may be configured as a first compensation pixel P21.

At the side way from the display area AA, the second pixel row PP2 may include a plurality of compensation pixels P2; and the compensation pixel P2 having the largest distance with the first edge A1 may be configured as a second compensation pixel P22.

Along the row direction X, the distance between the first compensation pixel P12 and the second compensation pixel P22 may be referred to as d; and $0 \leq d < D$.

In one embodiment, the pixels P are transflective pixels. Thus, the display panel may be able to reflect the ambient light; and may also have a back-light source. When the ambient light is sufficient, the back-light source may be turned off. Accordingly, the display panel may be operated at a reflective mode; and utilize the reflected light to realize the display function. When the ambient light is insufficient, the back-light source may be illuminated; and the display panel may be operated in the transmission mode. Therefore, the transflective display panel may be mainly used for small and medium-sized products, such as mobile phones, etc.; and may be able to satisfy the demands of lightness and energy saving.

Figure 4:
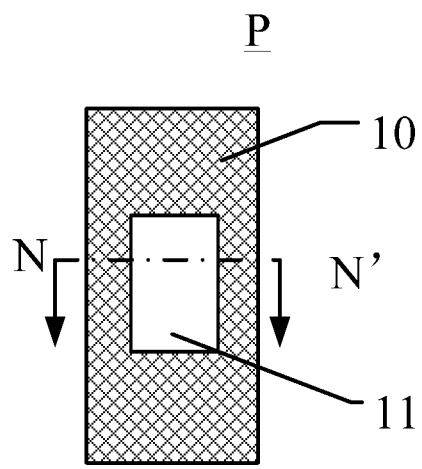
FIG. 4 illustrates a planar view of a pixel of an exemplary display panel in FIG. 2 consistent with various disclosed embodiments.

Hereinafter, the structure of a transflective pixel is exemplarily described. FIG. 4 illustrates a top view of a pixel of an exemplary display panel in FIG. 2 consistent with various disclosed embodiments; and FIG. 5 an NN'-sectional view of the display panel in FIG. 2.

Figure 5:
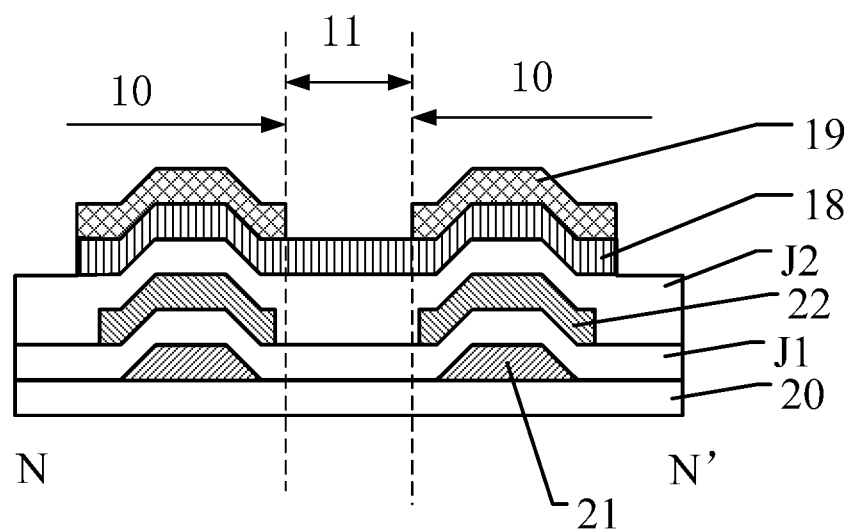
FIG. 5 illustrates a NN'-sectional view of an exemplary display panel in FIG. 4 consistent with various disclosed embodiments.

As shown in FIG. 4 and FIG. 5, the pixel P may be disposed on a substrate 20. The pixel P may include a first metal layer 21, a second metal layer 22, a pixel electrode 18, and a reflective layer 19. The first metal layer 21 and the second metal layer 22 may form a storage capacitor. The pixel electrode 18 and the reflective layer 19 may be electrically connected to each other. The reflective layer 19 may be used to reflect the ambient light. The reflective layer 19 may not be formed over the transmission area 11 so to allow the light to transmit out from the transmission area 11. In one embodiment, the pixel P may further include a first insulating layer J1 and a second insulating layer J2.

For illustrative purposes, FIG. 4 and FIG. 5 are only illustrative of the structure of the transflective pixel P, and are not intended to limit the structure of the pixel P.

In the disclosed display panel, the plurality of pixels P may include edge pixels P1; and the edge pixels P1 may be disposed at an edge area of the display area AA. In particular, at least portions of the transmission areas 11 of the edge pixels P1 may be disposed in the display area AA. Light may transmit out from the transmission areas 11 of the edge pixels P1. The transmission areas 11 of the edge pixels P1 may also be used for display.

Further, in a same pixel row PP, with the edge pixels P1 as a boundary, the transmission area 11 of at least one pixel P disposed on the side of the edge pixels P1 away from the display area AA may be entirely disposed in the non-display area NA. The transmission area 11 of at least one pixel P disposed on the side of the edge pixel P1 adjacent to the display area AA may be at least partially disposed in the display area AA. The transmission area 11 being at least partially disposed in the display area AA may allow light to transmit out for display. The specific number of the pixels P of the edge pixels P1 adjacent the display area AA may be set according to the actual requirements of the display panel. Similarly, the specific number of the pixels P of the edge pixels P1 away from the display area AA may be determined according to the actual requirements of the display panel.

In one embodiment, two edges pixels P1 may be included in a sample pixel row PP. The two edge pixels P1 may be disposed at two ends of the pixel row PP, respectively.

In one embodiment, the compensation pixels P2 may be disposed in the display panel. The transmission areas 11 of the compensation pixels P2 may entirely be disposed in the non-display area NA, but at least portions of the transmission areas 11 of the compensation pixels P2 may not be covered by the light shielding layer BM such that the light may transmit out from the transmission areas 11 of the compensate pixels P2. The reflective areas 10 of the compensation pixels P2 disposed in the non-display area NA may be blocked by the light shielding layer BM.

In particular, in the disclosed display panel, the light shielding layer BM may be patterned to have hollowed portions (not shown). The transmission areas 11 of the compensation pixels P2 may be partially or entirely disposed in the hollowed portions of the light shielding layer BM. Thereby, at least portions of the transmission areas 11 of the compensation pixels P2 may not be covered by the light shielding layer BM.

For illustrative purposes, the outer frame of the compensation pixel P2 is indicated by a dashed box.

In one embodiment, the compensation pixels P2 may only be disposed in portions of the pixel rows PP in the display panel. In some embodiments, the compensation pixels P2 may be disposed in all the pixel rows PP in the display panel. In practical applications, the positions of the compensation pixels P2 may be determined according to the specific shape of the display area of the display panel.

The display area AA may include a segment of the first edge A1. In one embodiment, the specific shape of the first edge A1 may not be limited. When the first edge A1 is a straight line segment, the extending direction of the first edge A1 may intersect with both the row direction X and the column direction Y. When the first edge A1 is a curve, the tangent at any point on the first edge A1 may intersect with both the row direction X and the column directions Y.

Further, along the row direction X, the distance between the first edge pixel P11 and the second edge pixel P12 may be referred to as D. The compensation pixel P2 may be disposed in the disclosed display panel. Along the row direction X, the distance between the first compensation pixel P21 and the second compensation pixel P22 may be referred to as d; and D>d.

In the disclosed display panel, the value of D may be greater than the value of d. In the first pixel row PP1 and the adjacent second pixel row PP2, the distance between the first edge pixel P11 and the second edge pixel P12 may be substantially large. If the compensation pixels P2 is not disposed in the display panel, the display effect at the first edge A1 may have the zigzag phenomenon. When the compensation pixels P2 are disposed in the display panel, since the light may transmit through the transmission areas 11 of the compensation pixels P2, and may have a display function, a portion of the light may still transmit from the side of the first edge A1 adjacent to the non-display area NA. Thus, a clear boundary between light and dark at the first edge A1 may be avoided. Moreover, because the value of D may be set to be greater than the value of d, the transition between the first compensation pixel P21 and the second compensation pixel P22 may be substantially smooth. The zigzag phenomenon at the first edge A1 may be weakened; and the display quality of the display panel may be improved.

Figure 6:
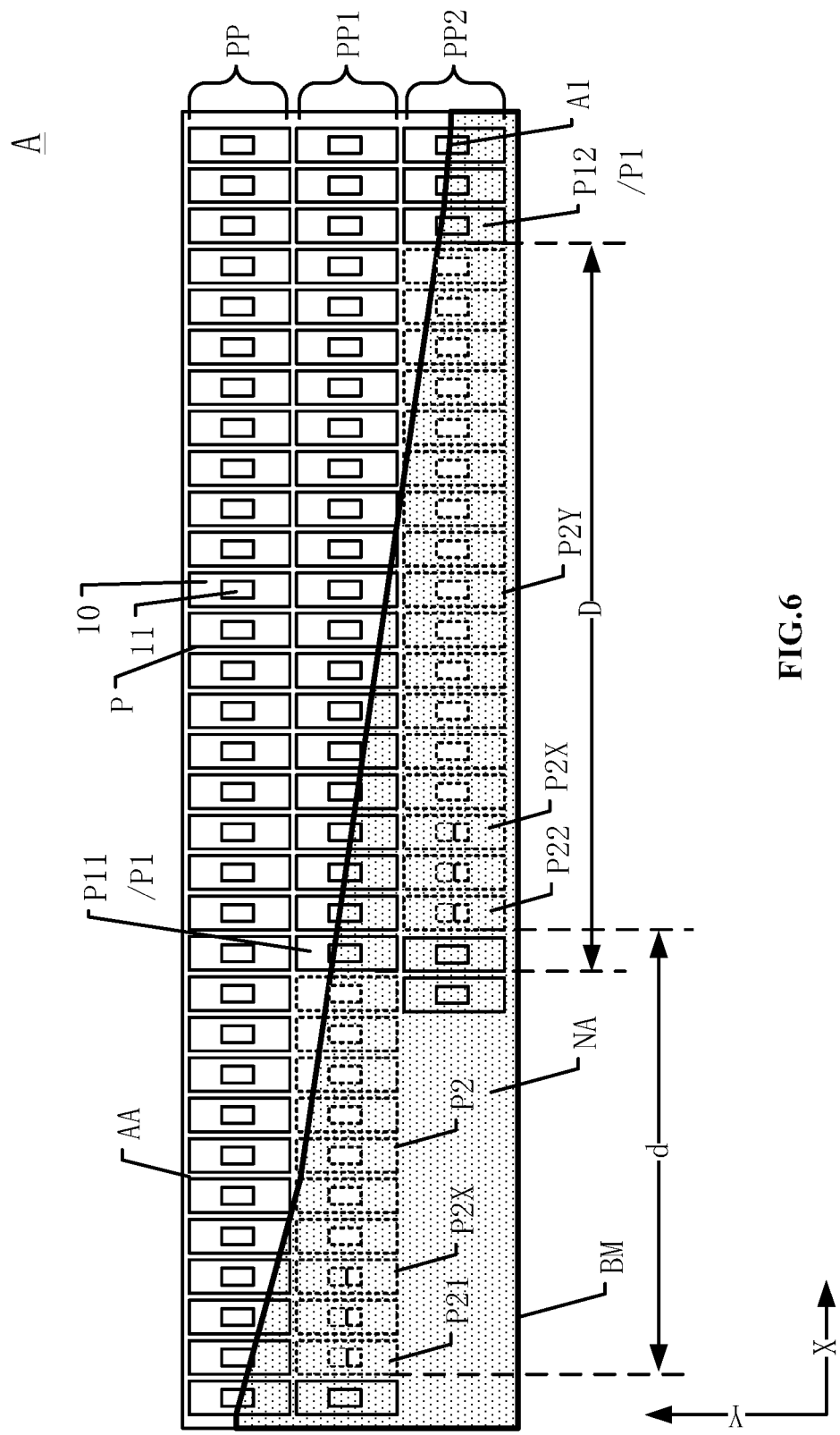
FIG. 6 illustrates anther zoomed-in view of the region A in FIG. 2 consistent with various disclosed embodiments.
Figure 7:
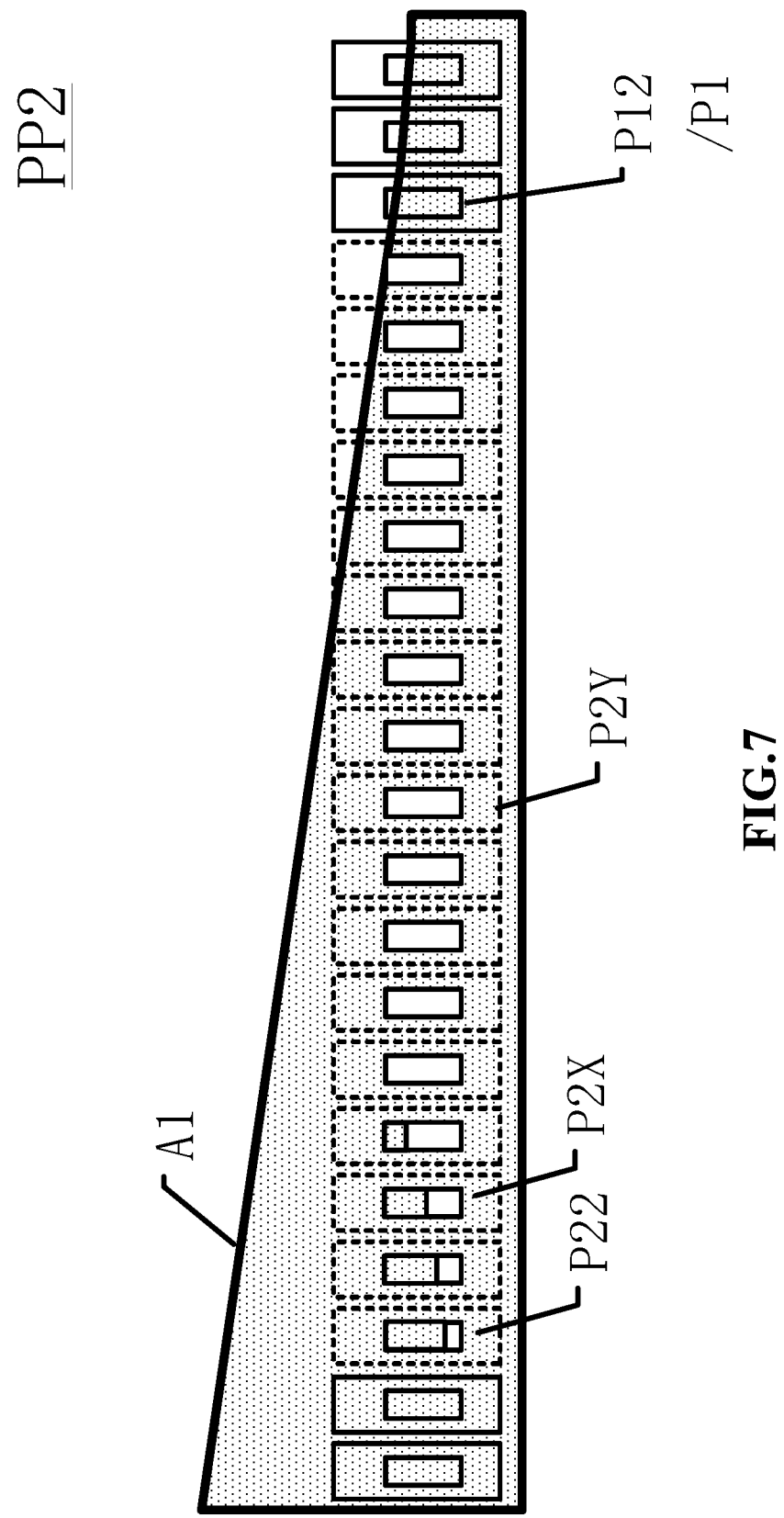
FIG. 7 illustrates a second pixel row in the FIG. 6 consistent with various disclosed embodiments.

For illustrative purposes, in the display panel illustrated in FIG. 3, the transmission areas 11 of the compensation pixels P2 may not covered by the light shielding layer BM. In some embodiments, portions of the transmission areas the compensation pixels may be covered by the light shielding layer. The corresponding structure is illustrated in FIG. 6 and FIG. 7. FIG. 6 illustrates another zoomed-in view of the area A in FIG. 2 consistent with various disclosed embodiments. FIG. 7 illustrates a second pixel row in FIG. 6.

As shown in FIG. 6, in the compensation pixel P2X of the display panel, a portion of the transmission area 11 may be covered by the light shielding layer BM, and another portion of the transmission area 11 may not be covered by the light shielding layer BM. In the compensation pixel P2Y, the entire transmission area 11 may not be covered by the light shielding layer BM. In one embodiment, the compensation pixel P2X may be disposed on a side of the compensation pixel P2Y away from the display area AA.

That is, because the entire transmission area 11 may not be blocked by the light shielding layer BM, more light may transmit from the compensation pixel P2Y, and the compensation capability of the compensation pixel P2Y may be substantially strong. In the compensation pixel P2X, only the partial transmission area 11 may be covered by the light shielding layer BM, comparing with the compensation pixel P2Y, less light may transmit from the compensation pixel P2X; and the compensation ability of the compensation pixel P2X may be substantially weak. The compensation pixel P2X may be disposed at the side of the compensation pixel P2Y away from the display area AA.

Accordingly, the compensation effect may be weakened along the direction away from the display area AA, and a relatively obvious boundary between the light and the dark at the first edge A1 may be avoided. Thus, the compensation effect to the display panel may be more delicate, and the zigzag phenomenon at the first edge A1 may be weakened, and the display quality of the display panel may be improved.

For illustrative purposes, in FIG. 7, the second pixel row PP2 is used to describe the compensation pixel P2X and the compensation pixel P2Y. In the first pixel row PP1, the arrangement of the compensation pixel P2X and the compensation pixel P2Y may be referred to FIG. 7.

In one embodiment, as shown in FIG. 6 and FIG. 7, along the direction away from the display area AA, the areas of the transmission areas 11 not covered by the light shielding layer BM of the plurality of compensation pixels P2 may be gradually reduced. That is, the compensation ability of the plurality of compensation pixels P2 may be gradually increased. Thus, the delicateness of the compensation effect may be further improved. Accordingly, the zigzag phenomenon at the first edge A1 may be further weakened, and the display quality of the display panel may be improved.

In some embodiments, as shown in FIG. 2 and FIG. 3, along the row direction X, the first edge pixel P11 and the second edge pixel P12 may be different by M number of pixels. The first compensation pixel P21 and the second compensation pixels P22 may be different by N number of pixels. M and N are both positive integers, and M>N. In particular, in FIG. 3, M=18 and N=11. Because the number of pixels differing between the first edge pixel P11 and the second edge pixel P12 may be substantially large, if the compensation pixel P2 is not provided, the zigzag phenomenon may occur on the display effect at the first edge A1. After disposing the compensation pixel P2, the number of pixels differing between the first compensation pixel P21 and the second compensation pixel P22 may be substantially small, and the transition between the first compensation pixel P21 and the second compensation pixel P22 may be smoother in the display effect. Thus, the zigzag phenomenon at the first edge A1 may be weakened, and the display quality of the display panel may be improved.

In one embodiment, referring to FIG. 2 and FIG. 3, d≤200 µm. That is, in the first pixel row PP1 and the adjacent second pixel row PP2, the distance between the first compensation pixel P21 and the second compensation pixel P22 may be substantially small, for example, less than 200 µm. Thus, it may be difficult for the human eyes to perceive the difference between the first compensation pixel P21 and the second compensation pixel P22, and it may have a visually smooth display effect. Accordingly, the zigzag phenomenon at the first edge A1 may be further weakened, and the display quality of the display panel may be further improved.

Further, referring to FIG. 2 and FIG. 3, the plurality of compensation pixels P2 of the first pixel row PP1 may be continuously disposed; and the plurality of compensation pixels P2 of the second pixel row PP2 may be continuously disposed. In one embodiment, the plurality of compensation pixels P2 are continuously disposed, that is, the plurality of compensation pixels P2 may be disposed adjacent to each other, and the remaining non-compensation pixels may not be disposed in the middle of the plurality of compensation pixels P2. By continuously disposing the plurality of compensation pixels P2, the compensation effect may be continuous and uniform. Thus, the zigzag phenomenon at the first edge A1 may be further weakened, and the display quality of the display panel may be improved.

In the present disclosed display panel, the first edge of the display area may have various shapes. Hereinafter, the shape of the first edge is exemplarily described.

Figure 8:
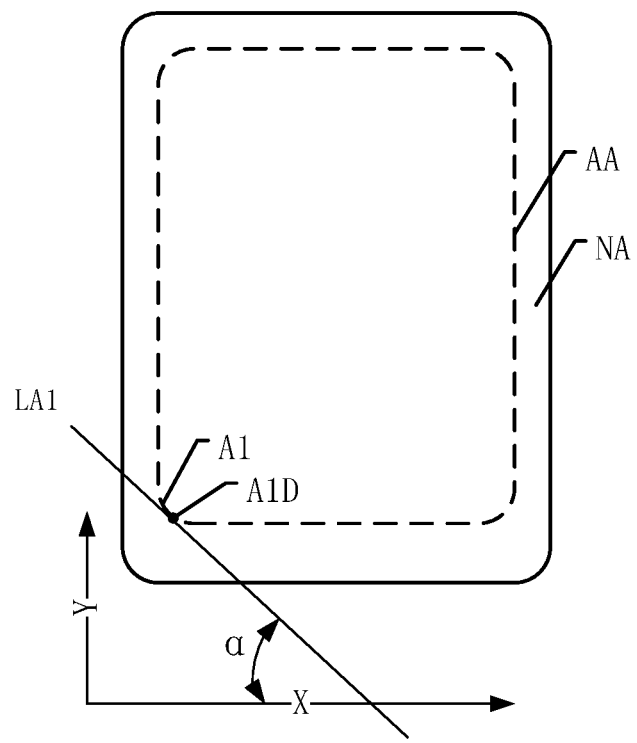
FIG. 8 illustrates another exemplary display panel consistent with various disclosed embodiments.

In some embodiments, the first edge A1 may be arc-shaped. In one embodiment, the display area has at least a segment of arc-shaped edge. The specific shape of the display area may be various. FIG. 8 illustrates a top view of another exemplary display panel according to various disclosed embodiment. As shown in FIG. 8, the display area AA of the display panel is a rectangle with a rounded corner, and the first edge A1 may be an arc of the rounded corner. In other embodiments, referring to FIG. 2, the display area AA may be circular, or elliptical, etc. The specific shapes of the display area in FIG. 8 and FIG. 2 are for illustrative purposes only, and the display area having at least one arc-shaped edge may be various and is not limited by the present disclosure.

Further, referring to FIG. 8, the acute angle between the tangential direction of any point at the first edge A1 and the row direction X is referred to as α, and α≤45°. In one embodiment, the angle between the tangent line LA1 at a point MD of the first edge A1 and the row direction X may reflect the approximate extension direction of the first edge A1.

In one embodiment, the smaller the angle between the tangent of a certain point at the first edge A1 and the row direction X is, the more the direction of the extension of the first edge A1 of the point tends to the row direction X. For example, when α=0°, the first edge A1 at the point may be parallel to the row direction X. The more the direction in which the first edge A1 extends is toward the row direction X, the more easily the pixel row intersecting the first edge A1 is zigzag. Therefore, by providing the compensation pixels in the pixel row intersecting with the first edge A1, the zigzag phenomenon at the first edge A1 may be weakened, and the display quality of the display panel may be improved.

Figure 9:
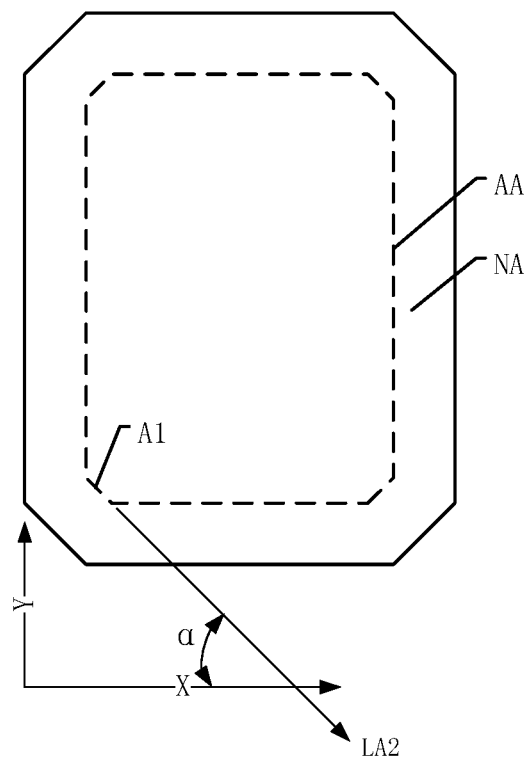
FIG. 9 illustrates another exemplary display panel consistent with various disclosed embodiments.

In some embodiments, the first edge A1 may be a line segment, and the extending (length) direction of the line segment may intersect with both the row direction and the column direction. In one embodiment, the first edge is a beveled edge. FIG. 9 illustrates a top view of another exemplary display panel according to various disclosed embodiments. As shown in FIG. 9, the extending direction of the first edge A1 intersects with both the row direction X and the column direction Y. In some embodiments, the shape of the display area AA may be a rectangle having a chamfered corner.

Further, referring to FIG. 9, the acute angle between the extending direction LA2 of the first edge A1 and the row direction X is referred to as α, and α ≤ 45°. In one embodiment, the smaller the angle between the extending direction LA2 of the first edge A1 and the row direction X is, the more the extension direction of the first edge A1 tends to the row direction X. For example, when α=0°, the first edge A1 is parallel to the row direction X. The more the direction in which the first edge A1 extends is toward the row direction X, the more easily the pixel row intersecting with the first edge A1 appears to be zigzag. Therefore, by providing the compensation pixels in the pixel row intersecting with the first edge A1, the zigzag phenomenon at the first edge A1 may be weakened, and the display quality of the display panel may be improved.

Figure 10:
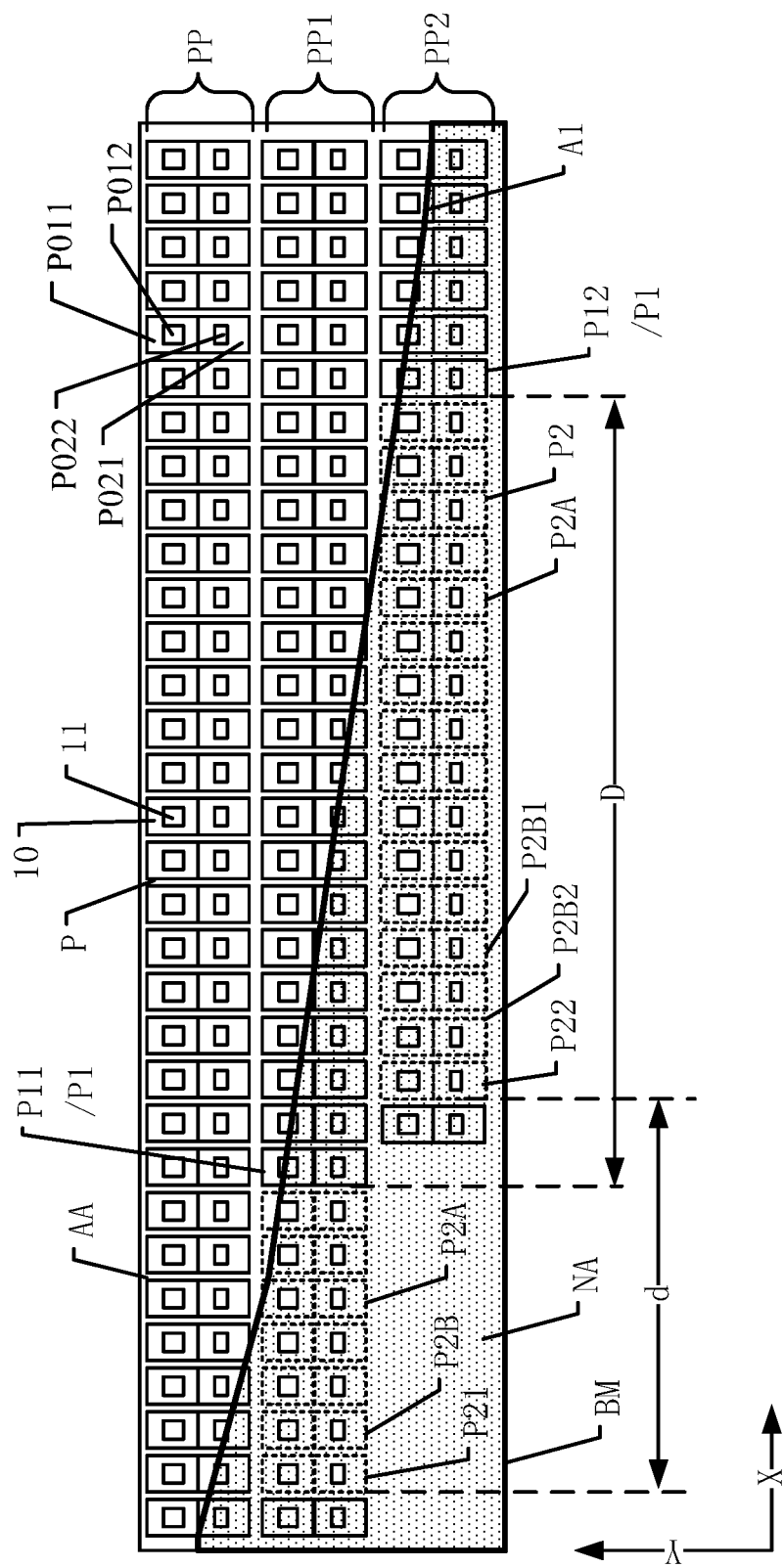
FIG. 10 illustrates a portion of another exemplary display panel consistent with various disclosed embodiments.
Figure 11:
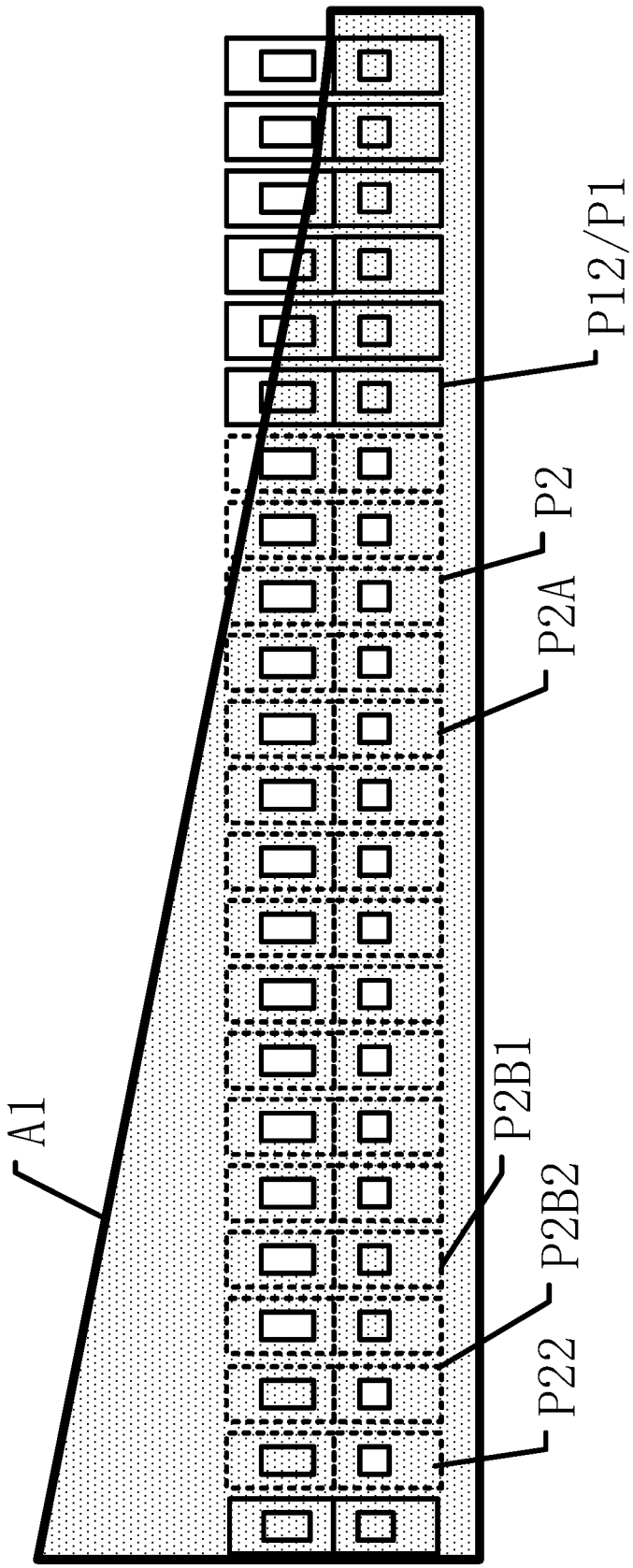
FIG. 11 illustrates a second pixel row in the FIG. 10 consistent with various disclosed embodiments.
Figure 12:
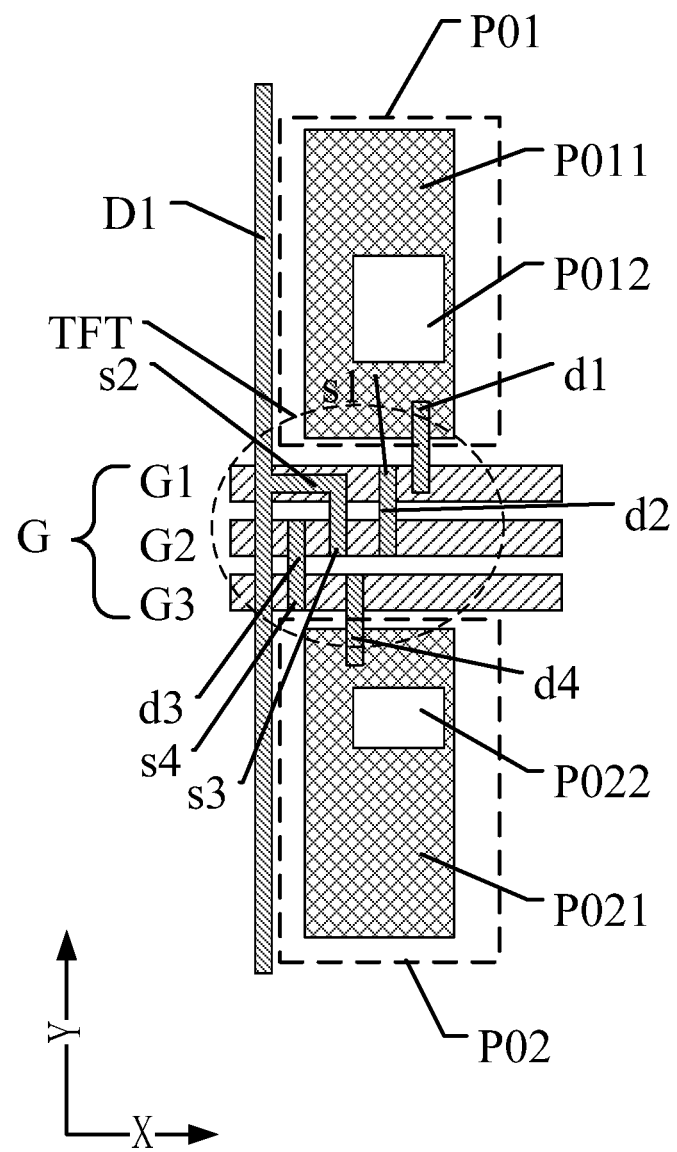
FIG. 12 illustrates a top view of pixels of an exemplary display panel in FIG. 10 consistent with various disclosed embodiments.
Figure 13:
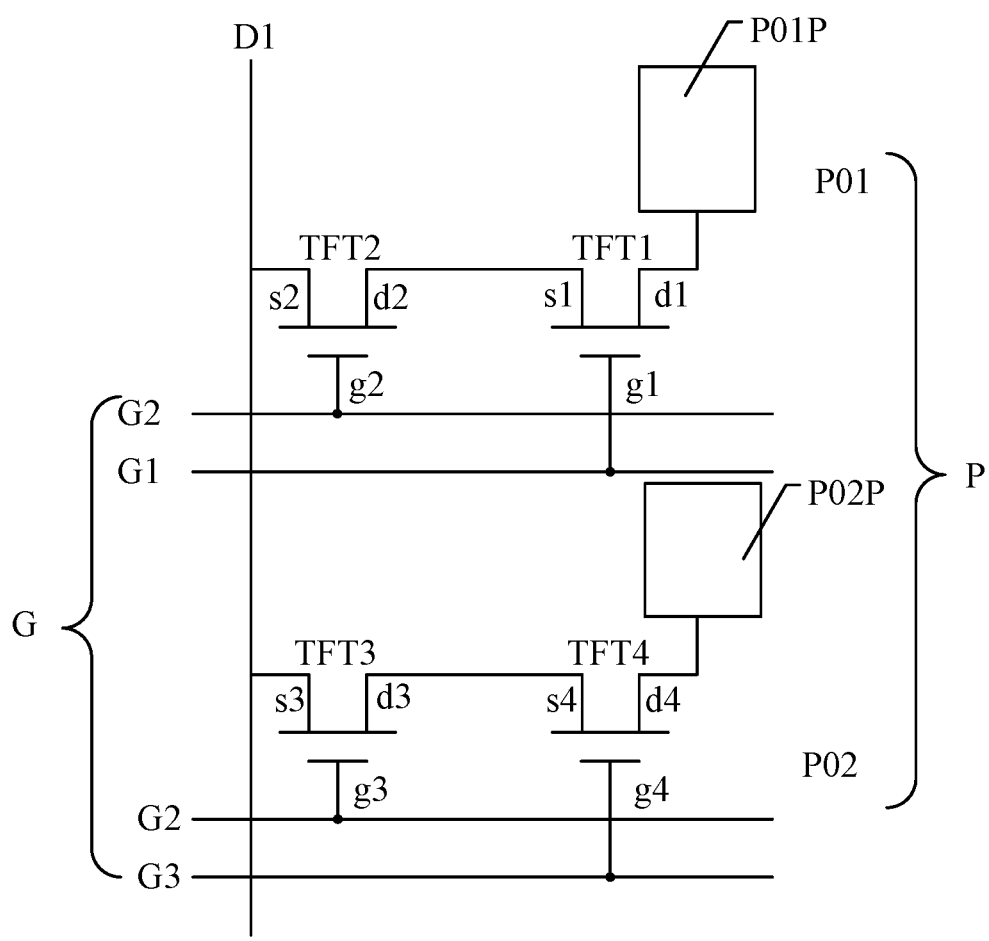
FIG. 13 illustrates an equivalent circuit of pixels in FIG. 12 consistent with various disclosed embodiments.

FIG. 10 illustrates a portion of another exemplary display panel consistent with various disclosed embodiments. FIG. 11 illustrates a second pixel row in the FIG. 10. FIG. 12 illustrates a top view of pixels of an exemplary display panel in FIG. 10. FIG. 13 illustrates an equivalent circuit of pixels in FIG. 12.

As shown in FIG. 10 and FIG. 12, the pixel P may include a first sub-pixel P01 and a second sub-pixel P02 arranged along the column direction Y. The first pixel P01 may include a first reflective area P011 and a first transmission area P012. The first reflective area P011 may be disposed around the first transmission area P012. The second pixel P02 may include a second reflective area P021 and a second transmission area P022. The second reflective area P021 may be disposed around the second transmission area P022. That is, in the pixel P, the reflective area 10 may include the first reflective area P011 and the second reflective area P021, and the transmission area 11 may include the first transmission area P012 and the second transmission area P022.

In one embodiment, one pixel P may include two sub-pixels. The two sub-pixels may multiplex a gate line and a transistor. The specific structure and equivalent circuit of the pixel P may refer to FIG. 12 and FIG. 13. As shown in FIG. 12 and FIG. 13, in the pixel P, the first sub-pixel P01 and the second sub-pixel P02 may include a set of gate lines G and a set of thin film transistors (TFTs). The set of gate lines G may include a first gate line G1, a second gate line G2, and a third gate line G3. The set of TFTs may include a first thin film transistor TFT1, a second thin film transistor TFT2, a third thin film transistor TFT3, and a fourth thin film transistor TFT4. The first pixel P01 may include a first pixel electrode P01P, and the second pixel P02 may include a second pixel electrode P02P.

In the same pixel P, the gate A1 of the first thin film transistor TFT1 may be electrically connected to the first gate line G1. The first terminal s1 of the first thin film transistor TFT1 may be electrically connected to the second terminal d2 of the second thin film transistor TFT2. The second terminal d1 of the first thin film transistor TFT1 may be electrically connected to the first pixel electrode P01P.

Further, the gate g2 of the second thin film transistor TFT2 may be electrically connected to the second gate line G2, and the first pole s2 of the second thin film transistor TFT2 may be electrically connected to a data line D1.

Further, the gate g3 of the third thin film transistor TFT3 may be electrically connected to the second gate line G2. The first terminal s3 of the third thin film transistor TFT3 may be electrically connected to the data line D1. The second terminal d3 of the third thin film transistor TFT3 may be electrically connected to the first terminal s4 of the fourth thin film transistor TFT4.

Further, the gate g4 of the fourth thin film transistor TFT4 may be electrically connected to the third gate line G3. The second terminal d4 of the fourth thin film transistor TFT 2 may be electrically connected to the second sub-pixel electrode P02P.

In one embodiment, in the same pixel P, the area of the first sub-pixel P01 may be equal to the area of the second sub-pixel P02; and the area of the first transmission area P012 may be equal to the area of the second transmission area P022. In the disclosed display panel, in the pixel P, the first sub-pixel P01 and the second sub-pixel P02 may be respectively controlled. By setting the size of the first transmission area P012 to be different the size of the second transmission area P022, and/or by setting the color of the first sub-pixel P01 to be different from the color of the second sub-pixel P02, the pixel P may be made richer in color.

In some embodiments, referring to FIG. 10 and FIG. 11, the plurality of compensation pixels P2 may include a plurality of total compensation pixels P2A and a plurality of partial compensation pixels P2B. The first transmission areas P012 of the total compensation pixels P2A and the second transmission areas P022 may not both be covered by the light shielding layer BM. One of the first transmission area P012 and the second transmission areas P022 of the partial compensation pixel P2B may not be covered by the light shielding layer BM.

In particular, the first transmission area P012 of the partial compensation pixel P2B may not be covered by the light shielding layer BM, or the second transmission area P022 of the partial compensation pixel P2B may not be covered by the light shielding layer BM. The partial compensation pixel P2B may include a first partial compensation pixel P2B1 and a second partial compensation pixel P2B2. The first transmission area P012 of the first partial compensation pixel P2B1 may not be covered by the light shielding layer BM, and the second transmission area P022 of the second partial compensation pixel P2B2 may not be covered by the light shielding layer BM.

To clearly illustrate the technical solution of the present embodiment, in FIG. 10 and FIG. 11, the transmission area of the partial compensation pixel P2B covered by the light shielding layer BM is illustrated by a solid line frame, and the transmission area not covered by the light shielding layer BM is illustrated by a dashed box. In particular, the first transmission area P012 of the first partial compensation pixel P2B1 is illustrated by a broken line frame; the second transmission area P022 of the first partial compensation pixel P2B1 is illustrated by a solid line frame; the second transmission area P022 of the second partial compensation pixel P2B2 is illustrated by a dashed box; and the first transmission area P012 of the second partial compensation pixel P2B2 is illustrated by a solid line frame. Further, to clearly illustrate the technical solution of the present embodiment, the second pixel row PP2 is taken as an example in FIG. 11 for describing the total compensation pixel P2A and the partial compensation pixel P2B. In the first pixel row PP1, the arrangement of the total compensation pixel P2A and the partial compensation pixel P2B may be referred to FIG. 11.

In one embodiment, the area of the second transmission area P022 is smaller than the area of the first transmission area P012. Thus, the compensation effect of the second partial compensation pixel P2B2 may be weaker than the first partial compensation pixel P2B1. The second partial compensation pixel P2B2 may be disposed at a side of the first partial compensation pixel P2B1 away from the display area AA such that the compensation effect is gradually weakened along the direction away from the display area AA in the same pixel row PP. Thus, the compensation effect to the display panel may be more delicate.

In the disclosed display panel, the first transmission area P012 and the second transmission area P022 of the total compensation pixel P2A may all have light transmitting out for display. Thus, the compensation effect may be stronger. The first transmission area P013 or the second transmission area P022 of the partial compensation pixel P2B may have light transmitting out. Thus, the compensation effect may be weaker than the compensation effect of the total compensation pixel P2A. By setting the compensation pixel P2 as the total compensation pixel P2A and the partial compensation pixel P2B, the display panel may be compensated according to the specific display effect. For example, the full compensation pixel P2A may be disposed at a position where a strong compensation effect is required, and the partial compensation pixel P2B may be disposed at a position where a weak compensation effect is required. Thus, the compensation effect of the display panel may be more delicate; the zigzag phenomenon at the first edge A1 may be further weakened; and the display quality of the display panel may be improved.

In some embodiments, referring to FIG. 10, the first pixel row PP1 may include at least one partial compensation pixel P2B and at least one total compensated pixel P2A. Further, in the first pixel row PP1, the partial compensation pixel P2B may be disposed at the side of the total compensation pixel P2A away from the first edge A1.

Further, in some embodiments, the second pixel row PP2 may include at least one partial compensation pixel P2B and at least one total compensation pixel P2A. In the second pixel row PP2, the partial compensation pixel P2B may be disposed at the side of the full compensation pixel P2A away from the first edge A1.

In one embodiment, in a same pixel row PP, the partial compensation pixel P2B may be disposed at the outermost end of the pixel row PP. That is, the partial compensation pixel P2B may be disposed at the side of the total compensation pixel P2A away from the first edge A1. Because the compensation effect of the partial compensation pixel P2B may be weaker than the total compensation pixel P2A, the compensation effect may be weakened along the direction away from the first edge A1 and the direction away from the display area AA. Accordingly, a relatively obvious boundary between light and dark appearance at the first edge A1 may be avoided. Thus, the compensation effect to the display panel may be more delicate; the zigzag phenomenon at the first edge A1 may be further weakened; and the display quality of the display panel may be further improved.

Figure 14:
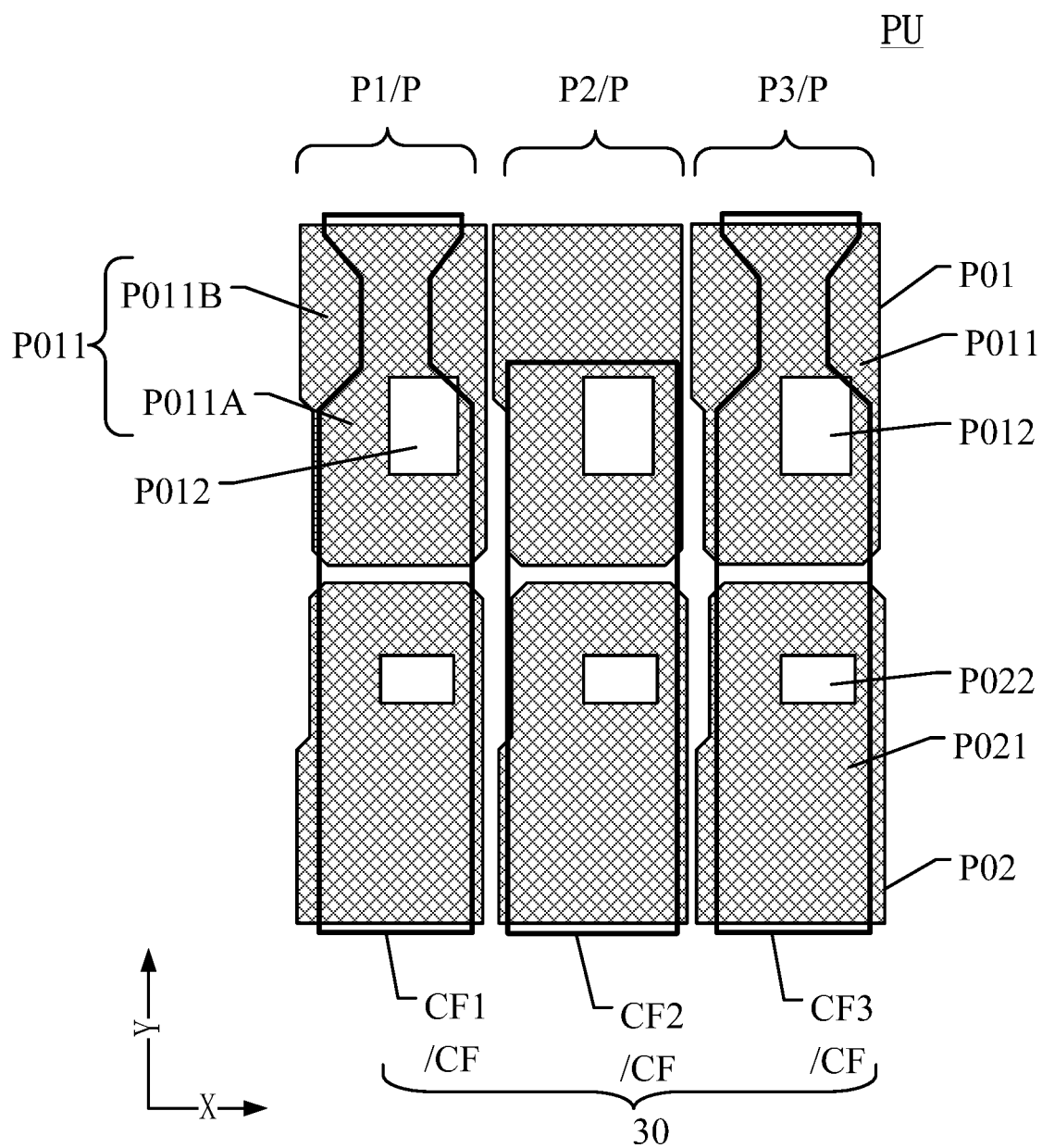
FIG. 14 illustrates a top view of a pixel unit of an exemplary display panel in FIG. 12 consistent with various disclosed embodiments.

In some embodiments, as shown in FIG. 10 and FIG. 14, the display panel may include a plurality of pixel units (PUs). Each of the plurality of pixel units (PU) may include three adjacent pixels arranged along the row direction X. That is, three adjacent pixels of the display panel form a pixel unit (PU).

Referring to FIG. 14, the display panel may include a color filter layer 30, and the color filter layer 30 may include color filters (CFs) of three different colors. In a same pixel unit PU, colors of the color filters covering the three pixels P may be different.

The three adjacent pixels P may include a first color pixel P1, a second color pixel P2, and a third color pixel P3, respectively. The first color pixel P1 may be covered by a first color filter CF1 having a first color, the second color pixel P2 may be covered by a second color filter CF2 having a second color, and the third color pixel P3 may be covered by a third color filter CF3 having a third color.

In one embodiment, the first color pixel P1 may be a red pixel, the second color pixel P2 may be a green pixel, and the third color pixel P3 may be a blue pixel. The specific colors of the three pixels P are not limited by the present disclosure.

Further, referring to FIG. 10 and FIG. 14, in the same pixel, the first reflective area P011 may include a first sub-reflective area P011A and a second sub-reflective area P011B. The color filter CF may cover the first sub-reflective area P011A and the second reflective area P021. The color filter CF may not cover the second sub-reflective area P011B.

In one embodiment, the color filter CF may cover the first sub-reflective area P011A and the second reflective area P021. Thus, the color of the light reflected by the first sub-reflective area P011A and the second reflective area P021 after being filtered by the color filter CF may be the same as the color of the color filter CF. The first sub-reflecting area P011A and the second reflective area P021 may be reflective areas of color light. The color filter CF may not be disposed in the second sub-reflective area P011B. Thus, the light reflected by the second sub-reflective area P011B may be basically the primary color of the ambient light, and the second sub-reflective area P011B may be a white light-emitting area.

Because the color filter CF may cover only a portion of the reflective area of the first pixel P01, the second sub-pixel P02 may entirely covered by the color filter CF, the display effects of the first sub-pixel P01 and the second sub-pixel P02 may be different. In particular, when a same voltage signal is applied to the first sub-pixel P01 and the second sub-pixel P02, the saturation the color displayed by the second sub-pixel P02 may be higher.

The disclosed display panel may be able to realize low-power display. When displaying, the chip may only transmit high levels and low levels. Because the color saturation of the first sub-pixel and the second sub-pixel may be different, and the areas of the transmission areas may be different, each pixel may include four display states. In particular, the four display states of one pixel may include: 1) the first sub-pixel black state, the second sub-pixel black state; 2) the first sub-pixel white state, the second sub-pixel white state; 3) the first sub-pixel black state, the second sub-pixel white state; and 4) the first sub-pixel white state, the second sub-pixel black state. Because the color saturation displayed by the first sub-pixel and the second sub-pixel may be different and the areas of the transmission areas may be different, the display effects of the third 3) display state and the fourth 4) display state may be different. When three pixels P are included in one pixel unit PU, the one pixel unit PU may be able to display 64 display states. Thus, the low power consumption and transflective display panel may have richer color variations.

In some embodiments, referring to FIG. 10 and FIG. 14, a portion of the reflective area 10 of the compensation pixel P2 may not be covered by the light shielding layer BM. In the present embodiment, the portion of the reflective area 10 of the compensation pixel P2 may not be covered by the light shielding layer BM, and a portion of the reflective area 10 of the compensation pixel P2 may also not be covered by the light shielding layer BM to further improve the compensation capability of the compensation pixel P2.

In one embodiment, the second sub-reflective area P011B of the compensation pixel P2 may not covered by the light shielding layer BM. In this embodiment, the light shielding layer BM may not cover the second sub-reflection area P011B of the white light-emitting area, and the compensation effect of the compensation pixel may be improved.

The present disclosure also provides a display apparatus. The display apparatus may include the disclosed display panel or other appropriate display panel.

Figure 15:
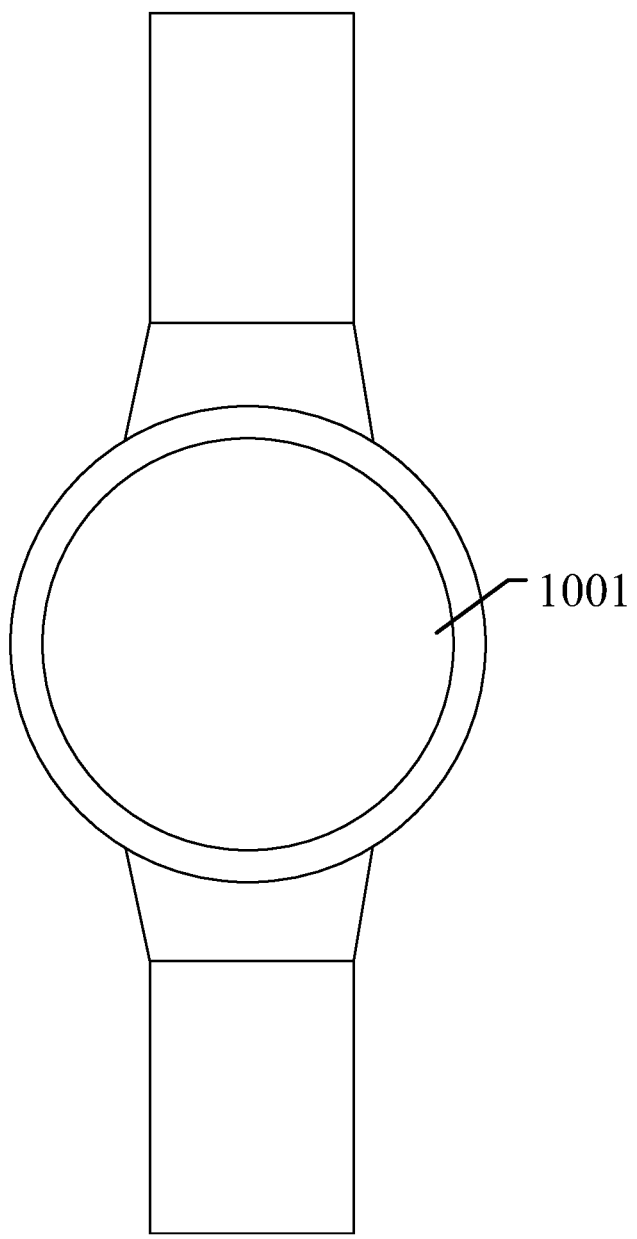
FIG. 15 illustrates an exemplary display apparatus consistent with the various disclosed embodiments.

FIG. 15 illustrates an exemplary display apparatus consistent with various disclosed embodiments. As shown in FIG. 15, the display apparatus 1000 may include a display panel 1001. The display panel 1001 may be any one of the display panels provided by the above embodiments of the present disclosure or other appropriate display panels.

In one embodiment, for illustrative purposes, a watch is illustrated in FIG. 15 for describing the display apparatus 1000. In some embodiments, the display apparatus may be other display apparatus having a display function, such as a cell phone, a computer, a television, a tablet computer, an on-board display apparatus, or a virtual reality apparatus, etc. The specific display apparatus is not limited by the present disclosure.

The display apparatus provided by the present disclosure may have the beneficial effects provided by disclosed display panels. The details may be referred to the detailed descriptions of the disclosed display panels, and the details are omitted herein.

The disclosed display panels and display may have at least the following beneficial effects. Compensation pixels may be disposed in the disclosed display panel. Because the light may transmit through the transmission areas of the compensation pixels, and have a display function. A portion of the light may transmit from a side of the first edge adjacent to the non-display area. Thus, a clear boundary between light and dark at the first edge may be avoided. Moreover, the value of D may be set to be greater than d, the transition between the first compensation pixel and the second compensation pixel may be smoother in the display effect. Accordingly, the zigzag phenomenon at the first edge may be weakened, and the display quality of the display panel and the display apparatus may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising:
   a display area;
   a non-display area, wherein a first edge is between the display area and the non-display area; and
   a plurality of pixels, including a plurality of edge pixels and a plurality of compensation pixels, arranged as an array along a row direction and a column direction, the plurality of edge pixels and the plurality of compensation pixels providing a plurality of pixel rows and a plurality of pixel columns,
   wherein:
   the plurality of pixel rows include two adjacent pixel rows including a first pixel row and a second pixel row, wherein the first pixel row and the second pixel row are disposed in an area including the first edge;
   at least portions of transmission areas of the plurality of edge pixels are disposed in the display area;
   entire transmission areas of the plurality of compensation pixels are disposed in the non-display area;
   a compensation pixel in a plurality of compensation pixels in the first pixel row at a side of the first edge away from the display area and having a largest distance from the first edge is configured as a first compensation pixel;
   a compensation pixel in a plurality of compensation pixels in the second pixel row at the side of the first edge away from the display area and having a largest distance from the first edge is configured as a second compensation pixel;
   an edge pixel in the first pixel row is configured as a first edge pixel;
   an edge pixel in the second pixel row and, having a smallest distance from a first edge pixel along the row direction, is configured as the second edge pixel; and
   a distance d between the first compensation pixel in the first pixel row of the two adjacent pixel rows and the second compensation pixel in the second pixel row of the two adjacent pixel rows is smaller than a distance D between the first edge pixel in the first pixel row and the second edge pixel in the second pixel row.

2. The display panel according to claim 1, further including:
   a light shielding layer, wherein:
      each of the plurality of pixels includes a reflective area and a transmission area;
      in a same pixel row, at a side of the edge pixels of away from the display area, the transmission areas of pixels adjacent to the edge pixels are entirely disposed in the non-display area;
      at a side of the edge pixels adjacent to the display area, at least portions of the transmission areas of the pixels adjacent to the edge pixels are disposed in the display area; and
      portions of the transmission areas of the compensation pixels are not covered by the light shielding layer.

3. The display panel according to claim 1, wherein:
   along the row direction, M number of pixels are disposed between the first edge pixel and the second edge pixel;
   N number of pixels are disposed between the first compensation pixel and the second compensation pixel; and
   M>N, where M and N are integers.

4. The display panel according to claim 1, wherein:
   the first edge is a straight line segment intersecting with both the row direction and the column direction.

5. The display panel according to claim 4, wherein:
   an acute angle between an extending direction of the first edge and the row direction is a; and
   $\alpha \leq 45°$.

6. The display panel according to claim 1, wherein:
the first edge is an arc.

7. The display panel according to claim 6, wherein:
an acute angle between a tangent at any point of the first edge and the row direction is a; and
α≤45°.

8. The display panel according to claim 6, wherein:
the display area is one of a circle and an eclipse.

9. The display panel according to claim 1, wherein:
the plurality of compensation pixels in the first pixel row are disposed continuously; and
the plurality of compensation pixels in the first pixel row are disposed continuously.

10. The display panel according to claim 1, wherein each of the plurality of pixels comprises:
a first sub-pixel; and
a second sub-pixel,
wherein:
the first sub-pixel includes a first transmission area and a first reflective area disposed around the first transmission area; and
the second sub-pixel includes a second transmission area and a second reflective area disposed around the second transmission area.

11. The display panel according to claim 10, wherein:
in a same pixel, an area of the first sub-pixel is equal to an area of the second sub-pixel; and
an area of the first transmission area is not equal to an area of the second transmission area.

12. The display panel according to claim 11, further comprising:
a color filter layer,
wherein:
along the row direction, three adjacent pixels of the plurality of pixels of the display panel form a pixel unit;
the color filter layer includes three different colors of color filters; and
in a same pixel unit, the colors of the color filters covering the three pixels are different.

13. The display panel according to claim 12, wherein in a same pixel of the plurality of pixels, the first reflective area comprises:
a first sub-reflective area; and
a second sub-reflective area,
wherein:
the color filter covers the first sub-reflective area and the second reflective area; and
the color filter does not cover the second sub-reflective area.

14. The display panel according to claim 13, wherein:
partial reflective areas of the compensation pixels are not covered by the light shielding layer.

15. The display panel according to claim 14, wherein:
the second sub-reflective areas of the compensation pixels are not covered by the light shielding layer.

16. The display panel according to claim 10, wherein the plurality of compensation pixels comprise:
a plurality of total compensation pixels; and
a plurality of partial compensation pixels,
wherein:
the first transmission area and the second transmission area of the total compensation pixels are both not covered by a light shielding layer; and
one of the first transmission area and the second transmission area of the partial compensation pixel is not covered by the light shielding layer.

17. The display panel according to claim 16, wherein the first pixel row comprises:
at least one partial compensation pixel; and
at least one total compensation pixel,
wherein the partial compensation pixel is at a side of the total compensation pixel away from the first edge.

18. The display panel according to claim 16, wherein the second pixel row comprises:
at least one partial compensation pixel; and
at least one total compensation pixel,
wherein the partial compensation pixel is at a side of the total compensation pixel away from the first edge.

19. The display panel according to claim 1, wherein:
d≤200 μm.

20. A display apparatus, comprising:
a display panel, including:
a display area;
a non-display area, wherein a first edge is between the display area and the non-display area; and
a plurality of pixels, including a plurality of edge pixels and a plurality of compensation pixels, arranged as an array along a row direction and a column direction, the plurality of edge pixels and the plurality of compensation pixels providing a plurality of pixel rows and a plurality of pixel columns,
wherein:
the plurality of pixel rows include two adjacent pixel rows including a first pixel row and a second pixel row, wherein the first pixel row and the second pixel row are disposed in an area including the first edge;
at least portions of transmission areas of the plurality of edge pixels are disposed in the display area;
entire transmission areas of the plurality of compensation pixels are disposed in the non-display area;
a compensation pixel in a plurality of compensation pixels in the first pixel row at a side of the first edge away from the display area and having a largest distance from the first edge is configured as a first compensation pixel;
a compensation pixel in a plurality of compensation pixels in the second pixel row at the side of the first edge away from the display area and having a largest distance from the first edge is configured as a second compensation pixel;
an edge pixel in the first pixel row is configured as a first edge pixel;
an edge pixel in the second pixel row and, having a smallest distance from a first edge pixel along the row direction, is configured as the second edge pixel; and
a distance d between the first compensation pixel in the first pixel row of the two adjacent pixel rows and the second compensation pixel in the second pixel row of the two adjacent pixel rows is smaller than a distance D between the first edge pixel in the first pixel row and the second edge pixel in the second pixel row.

\* \* \* \* \*